United States Patent
Bartl et al.

(10) Patent No.: US 9,281,462 B2
(45) Date of Patent: Mar. 8, 2016

(54) THERMO-ELECTRIC POWER HARVESTING BEARING CONFIGURATION

(71) Applicants: Frank Bartl, Grenzach-Wyhlen (DE); Andreas Clemens Van Der Ham, Utrecht (NL)

(72) Inventors: Frank Bartl, Grenzach-Wyhlen (DE); Andreas Clemens Van Der Ham, Utrecht (NL)

(73) Assignee: AKTIEBOLAGET SKF, Gothenburg (SE)

( * ) Notice: Subject to any disclaimer, the term of this patent is extended or adjusted under 35 U.S.C. 154(b) by 0 days.

(21) Appl. No.: 14/350,190

(22) PCT Filed: Oct. 3, 2012

(86) PCT No.: PCT/EP2012/069534
§ 371 (c)(1),
(2) Date: Apr. 7, 2014

(87) PCT Pub. No.: WO2013/050415
PCT Pub. Date: Apr. 11, 2013

(65) Prior Publication Data
US 2014/0376849 A1 Dec. 25, 2014

Related U.S. Application Data

(60) Provisional application No. 61/544,100, filed on Oct. 6, 2011.

(51) Int. Cl.
| | |
|---|---|
| *F16C 37/00* | (2006.01) |
| *H01L 35/30* | (2006.01) |
| *F16C 41/00* | (2006.01) |
| *H01L 35/28* | (2006.01) |
| *F16C 35/04* | (2006.01) |
| *H02J 5/00* | (2006.01) |

(52) U.S. Cl.
CPC .............. *H01L 35/30* (2013.01); *F16C 35/042* (2013.01); *F16C 37/007* (2013.01); *F16C 41/004* (2013.01); *H01L 35/28* (2013.01); *H02J 5/005* (2013.01)

(58) Field of Classification Search
CPC ..... F16C 37/007; F16C 41/004; F16C 35/042
See application file for complete search history.

(56) References Cited

U.S. PATENT DOCUMENTS

2010/0163089 A1  7/2010  Donley
2014/0341490 A1* 11/2014  Ito et al. ................... 384/471

FOREIGN PATENT DOCUMENTS

| | | |
|---|---|---|
| DE | 102007029571 A1 | 11/2008 |
| EP | 094699 A1 | 1/1996 |
| JP | 2003168182 A | 6/2003 |
| WO | 2011065882 A1 | 6/2011 |

* cited by examiner

*Primary Examiner* — Thomas R. Hannon
(74) *Attorney, Agent, or Firm* — Bryan Peckjian; SKF USA Inc. Patent Dept.

(57) ABSTRACT

A power generating bearing assembly (100) comprises a bearing subassembly (120) retained by a bearing housing (110). During operation, friction and other factors increase a temperature of the bearing assembly (100). The housing (110) can optionally include a bearing cooling passage system comprising at least one liquid cooling passage (134) formed internally therein. The liquid cooling passage (134) would be routed proximate the bearing subassembly (120) to remove heat therefrom. A thermo-generator cavity (180) extends inward from an exterior surface of the housing (110), terminating at a cavity end wall (182). The cavity (180) is formed at a location identified having a higher temperature. A Thermo-Electric Generator (TEG) (200) is inserted within the cavity (180) and thermally coupled to the end wall (182). The Thermo-Electric Generator (TEG) (200) utilizes a temperature difference between the end wall (182) and the ambient air to generated electric power. The power can be used to operate electrically powered devices, such as condition sensors (150), communication devices, and the like.

8 Claims, 4 Drawing Sheets

THERMO-ELECTRIC POWER HARVESTING BEARING CONFIGURATION

CROSS-REFERENCE TO RELATED

This is a United States National Stage Application claiming the benefit of International Application No. PCT/EP2012/069534 filed on Oct. 3, 2012, which claims priority to US Provisional Patent Application No. 61/544,100 filed on Oct. 6, 2011, both of which are incorporated herein by reference in their entireties.

BACKGROUND OF THE INVENTION

1. Technical Field of the Invention

The present invention relates to an apparatus and method for generating power utilizing a Thermo-Electric Generator (TEG) to convert thermal energy generated by rotation of a bearing within a bearing housing into electric energy.

2. Background Art

Bearings are used to support many rotating objects. Bearings are commonly integrated into a variety of machines. The bearings are a key factor contributing to the reliability of the machine. The system designed commonly installs one or more bearing condition monitoring devices to ensure the bearings remain in working order. The majority of the condition monitoring devices requires low voltage electrical power for operation. Some systems include other components that also utilize electrical power. One such electrically operated component can be a communication device for transferring the condition monitoring information to a remote service company.

Bearings can be integrated into many different machines having a wide variety of applications. The applications can be deployed at very remote, rural locations, commonly void of utility provided power.

Batteries provide a limited capacity, which dictates a limited supply and thus a limited run time. Obtaining power from a commercial utility source can be costly, particularly for remote installations. Transferring electrical power from a commercially available source can require running extensive and costly power cabling and support equipment. Maintenance of these systems must be considered. Replacement of batteries incurs both parts and labor costs. These concerns are aggravated for temporary installations.

During operation, the bearing can generate a significant amount of heat. Bearing which generate a significant amount of heat commonly include heat dissipation or thermal transfer systems. One exemplary thermal transfer system includes one or more integrated liquid cooling passages. Liquid coolant is pumped through the integrated liquid cooling passages extracting heat from the bearing or bearing assembly. The liquid coolant is passed through a heat exchanger to remove the extracted heat from the liquid coolant. The cooled coolant is returned to the bearing housing to repeat the heat extraction or thermal regulation process.

Thermo-Electric Generators (TEG's) are commonly available in a variety of form factors. They are available is a variety of different sizes and performance levels. Thermo-Electric Generators (TEG's) are offered utilizing either of two technologies: (a) normal thermo couples and (b) thin film technology.

Thermo coupled based Thermo-Electric Generators (TEG's) utilize a thermocouple consists of two conductors of different materials (usually metal alloys). Any junction of dissimilar metals will produce an electric potential related to temperature. The thermocouple produces a voltage in the vicinity of the point where the two conductors contact one another. The voltage produced is dependent on, but not necessarily proportional to, the difference of temperature of the junction to other parts of the respective conductors. Thermocouples are used in a variety of applications, including a temperature sensor, a device for converting a temperature gradient into electricity, and the like. Commercial thermocouples are inexpensive, interchangeable, are supplied with standard connectors, and can measure a wide range of temperatures. One advantage of a thermocouple over other methods of measuring a temperature is that thermocouples are self-powered.

A thermocouple can produce an electric current. The concept utilizes what is referred to as the Peltier effect. The Peltier effect is the presence of heat at an electrified junction of two different metals. When a current is made to flow through a junction composed of materials A and B, heat is generated at the upper junction at T2, and absorbed at the lower junction at T1. The Thermo-Electric Generator (TEG) applies the thermocouple in accordance with the reverse concept of the Peltier effect, whereby the presence of heat at the upper junction T2, and the presence of a reduced temperature at the lower junction at T1 the thermocouple generates a current.

The Thermo-Electric Generator (TEG) can utilize a series of thermocouples connected in series to form a thermopile, where all the hot junctions are exposed to a higher temperature and all the cold junctions to a lower temperature. The output is the sum of the voltages across the individual junctions, giving larger voltage and power output.

Thin film technology based Thermo-Electric Generators (TEG's) are fabricated utilizing Peltier cooler chips, or a generator based upon the Seebeck effect. The Thermo-Electric Generator (TEG) consists of leg pairs of n- and p-type material. Each leg pair generates a certain voltage. The voltage (U) generated by a Thermo-Electric Generator (TEG) is directly proportional to the number of leg pairs (N) and the temperature difference ($\Delta T$) between top and bottom side times the Seebeck coefficient ($\alpha$), where:

$$U = N(\text{times})\Delta T(\text{times})\alpha.$$

The Seebeck effect is caused by two things: charge-carrier diffusion and phonon drag. Charge carriers in the materials will diffuse when one end of a conductor is at a different temperature from the other. Hot carriers diffuse from the hot end to the cold end, since there is a lower density of hot carriers at the cold end of the conductor, and vice versa. If the conductor were left to reach thermodynamic equilibrium, this process would result in heat being distributed evenly throughout the conductor. The movement of heat (in the form of hot charge carriers) from one end to the other is a heat current and an electric current as charge carriers are moving.

Recently developed thermoelectric devices are made from alternating p-type and n-type semiconductor elements connected by metallic connectors. Semiconductor junctions are common in power generation devices, while metallic junctions are more common in temperature measurement. Charge flows through the n-type element, crosses a metallic interconnect, and passes into the p-type element.

The thermoelectric device can be utilized in either of two applications: (a) utilizing power to control temperature and (b) utilize a thermal difference to generate electric power. In the first configuration, where power is provide the thermoelectric device provides a thermal generating device, utilizing the Peltier effect to act as a cooler. In this configuration, electrons in the n-type element move opposite the direction of current and holes in the p-type element will move in the direction of current, both removing heat from one side of the device. In the second configuration, where a thermal difference is applied to the thermoelectric device, the thermoelectric device functions as a power generator. The heat source drives electrons in the n-type element toward the cooler region, creating a current through the circuit. Holes in the p-type element then flow in the direction of the current. Therefore, thermal energy is converted into electrical energy.

Thermo-Electric Generators (TEG's) can also utilize other effects, including:

(A) The Ettingshausen Effect, which is a thermoelectric (or thermo magnetic) phenomenon that affects the electric current in a conductor when a magnetic field is present, and/or (B) The Nernst effect, which is a thermoelectric (or thermo magnetic) phenomenon observed when a sample allowing electrical conduction is subjected to a magnetic field and a temperature gradient normal (perpendicular) to each other.

A variety of parameters are monitored to continuously determine a condition of a bearing. The application of the bearing may limit the availability or ease of providing electrical power to the sensors used to monitor the condition of the bearing. What is desired is a power generating system that can be integrated into the bearing assembly to harvest power from the bearing assembly and utilize the harvested power to generate electrical energy.

DISCLOSURE OF THE INVENTION

The present invention is directed towards an apparatus and respective method for generating electrical energy utilizing thermal energy generated during operation of a bearing or bearing assembly.

In a first aspect of the present invention, a power generating bearing assembly, the power generating bearing assembly comprising:

a bearing housing comprising:
  a bearing subassembly receptacle, and
  a thermo-generator cavity extending inward from an exterior surface of the bearing housing, the thermo-generator cavity terminating at a cavity end wall;
a bearing subassembly retained within the bearing subassembly receptacle; and
a Thermo-Electric Generator (TEG) located within the thermo-generator cavity, wherein the Thermo-Electric Generator (TEG) is in thermal communication with a surface of the cavity end wall,
wherein during operation, heat generated by rotation of the bearing subassembly elevates a temperature of the bearing housing, the Thermo-Electric Generator (TEG) converts a thermal difference between the bearing housing elevated temperature at the cavity end wall and an ambient temperature to electric power.

In a second aspect, the bearing housing further comprises at least one integrated liquid cooling passage, wherein the at least one integrated liquid cooling passage is routed proximate the bearing subassembly.

In another aspect, the at least one integrated liquid cooling passage is further defined having a low temperature coolant fluid section and an elevated temperature coolant fluid section.

In another aspect, the thermo-generator cavity is formed at a location proximate the elevated temperature coolant fluid segment of one of the at least one integrated liquid cooling passages.

In another aspect, the Thermo-Electric Generator (TEG) is thermally coupled to the thermo-generator cavity end wall using a thermally conductive material inserted therebetween.

In another aspect, a thermo-generator cavity filler is assembled between the Thermo-Electric Generator (TEG) and a thermoelectric generator cover plate. The thermo-generator cavity filler provides thermo conductivity between the thermoelectric generator cover plate and the cool side of the Thermo-Electric Generator (TEG).

In another aspect, cooling fins are thermally coupled to an exposed surface of the thermoelectric generator cover plate, wherein the cooling fins increase thermal cooling of the exposed surface of the thermoelectric generator cover plate, transferring the cooler temperatures to the Thermo-Electric Generator (TEG) via the thermo-generator cavity filler.

In another aspect, the thermo-generator cavity is installed proximate a cooling system discharge port.

In another aspect, the Thermo-Electric Generator (TEG) utilizes normal thermo couple technology.

In another aspect, the Thermo-Electric Generator (TEG) utilizes thin film technology.

In another aspect, the Thermo-Electric Generator (TEG) further comprises passive wireless transmission technology.

In another aspect, the Thermo-Electric Generator (TEG) is utilized to provide power to a separate electrically powered device.

In another aspect, the Thermo-Electric Generator (TEG) is utilized to power at least one bearing condition monitoring sensor.

In another aspect, the Thermo-Electric Generator (TEG) is utilized to power at least one bearing condition monitoring sensor associated with the same bearing assembly.

In another aspect, the Thermo-Electric Generator (TEG) is utilized to power at least one bearing condition monitoring sensor associated with the same bearing assembly and at least one bearing condition monitoring sensor associated with a separate bearing assembly located proximate the power generating bearing assembly.

One advantage of the present invention is the ability to easily incorporate a Thermo-Electric Generator (TEG) onto a bearing assembly to create a power harvesting bearing assembly. The conversion from a standard liquid cooled bearing assembly to a power harvesting bearing assembly can be accomplished by forming a thermo-generator cavity extending inwards from an exterior surface of the bearing housing, terminating at a thermo-generator cavity end wall. The Thermo-Electric Generator (TEG) is inserted within the thermo-generator cavity, and seated against the thermo-generator cavity end wall. The installation into a cavity within the housing avoids penetration of the integrated liquid cooling passage. This avoids any potential fluid leaks. The Thermo-Electric Generator (TEG) can be easily accessed for service by removing a thermoelectric generator cover plate. Embedding the Thermo-Electric Generator (TEG) within the thermo-generator cavity increases the temperature of the high temperature source, as the Thermo-Electric Generator (TEG) is positioned closer to the heat source.

Another advantage of the present invention is the ability to generate a continuous electrical current using thermal energy obtained from heat generated during operation of the bearing assembly. The inclusion of the liquid cooling system enhances a process of removing heat from the bearing assembly. The liquid cooling system can be used to increase the efficiency of the Thermo-Electric Generator (TEG) by collecting, directing and focusing the heat to a specific region of the bearing housing. The Thermo-Electric Generator (TEG) would be inserted within a thermo-generator cavity extending into the bearing housing at a location proximate the segment of the liquid cooling system carrying the elevated temperature coolant fluid.

One or more sensors can be employed to monitor a condition of a bearing. The sensors are commonly operated using electrical power. The sensors can monitor a variety of parameters to continuously determine a condition of a bearing. Communication devices could be employed as a vehicle to transfer information to a remote monitoring facility. These communication devices are also operated using electrical power. It is not uncommon where a system utilizing a bearing assembly would be located in a remote area where sourcing electrical power could be difficult. Bearing assemblies can be utilized on equipment deployed in remote locations. The application of the bearing assembly may limit the availability or ease of providing electrical power to the sensors used to monitor the condition of the bearing. The inclusion of an electrical power-generating device within a bearing assembly eliminates the need for an external source of electrical power. Additionally, by utilizing thermal energy obtained from a location within the bearing housing, the electrical energy is not drawing energy from the rotation of a bearing inner ring of the bearing subassembly or other rotating elements of the system. Therefore, the Thermo-Electric Generator (TEG) is not impacting the efficiency of the rotating elements of the system.

Another advantage of the present invention is the flexibility for the installation. The installation can be accomplished by thermally coupling the Thermo-Electric Generator (TEG) to any suitable location on the bearing housing. The efficiency can be optimized by determining the location on the bearing housing that has the highest temperature during operation. The temperature differential can be increased by forming a thermo-generator cavity extending inward from the surface of the bearing housing. The location of condition monitoring sensors could complicate any provisions for externally provided power for monitoring the condition of the bearing. The bearing(s) can be integrated into the equipment at a location that is difficult to access, particularly for wiring. The inclusion of a power generator within the bearing assembly optimizes a source for electrical power at a location proximate the sensors or other equipment requiring the electrical power. The thermo-generator cavity can be formed in any reasonable location on the bearing housing; with considerations for the location based upon the operating temperatures of the bearing assembly and a proximity to electrically operated components anticipating power from the Thermo-Electric Generator (TEG). This significantly reduces a length of wiring required. The reduced wiring avoids any accidentally interference or abrasion by any rotational movements or other movements of components of the equipment.

These and other features, aspects, and advantages of the invention will be further understood and appreciated by those skilled in the art by reference to the following written specification, claims and appended drawings, which follow.

BRIEF DESCRIPTION OF THE DRAWINGS

For a fuller understanding of the nature of the present invention, reference should be made to the accompanying drawings in which.

Like reference numerals refer to like parts throughout the several views of the drawings.

MODES FOR CARRYING OUT THE INVENTION

The following detailed description is merely exemplary in nature and is not intended to limit the described embodiments or the application and uses of the described embodiments. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to make or use the embodiments of the disclosure and are not intended to limit the scope of the disclosure, which is defined by the claims. For purposes of description herein, the terms "upper", "lower", "left", "rear", "right", "front", "vertical", "horizontal", and derivatives thereof shall relate to the invention as oriented in FIG. 1. Furthermore, there is no intention to be bound by any expressed or implied theory presented in the preceding technical field, background, brief summary or the following detailed description. It is also to be understood that the specific devices and processes illustrated in the attached drawings, and described in the following specification, are simply exemplary embodiments of the inventive concepts defined in the appended claims. Hence, specific dimensions and other physical characteristics relating to the embodiments disclosed herein are not to be considered as limiting, unless the claims expressly state otherwise.

Figure 1:
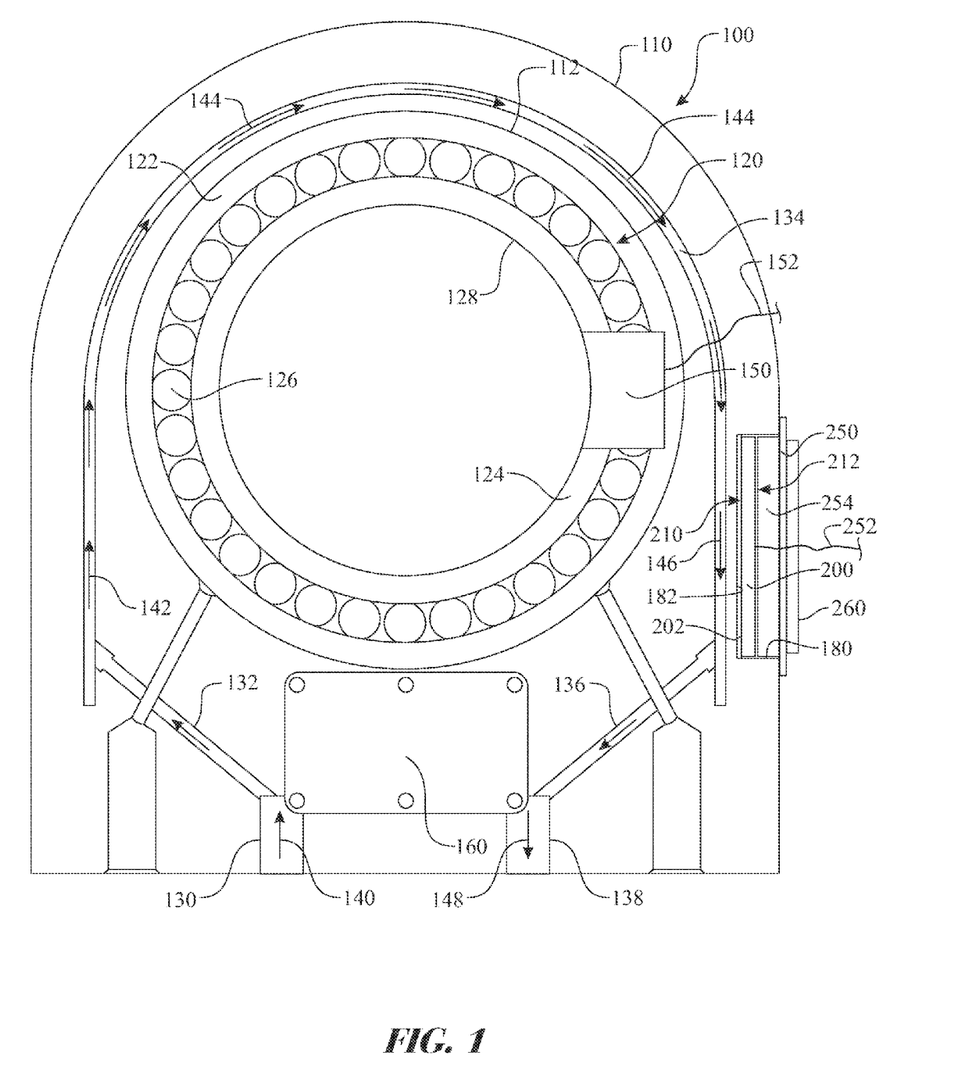
FIG. 1 presents an internal elevation view of an exemplary bearing assembly comprising a Thermo-Electric Generator (TEG) located within a thermo-generator cavity, wherein the Thermo-Electric Generator (TEG) is in thermal communication with an end wall of the thermo-generator cavity and utilizes a thermal difference between heat generated by operation of the bearing assembly and ambient air to generate electric power.
Figure 2:
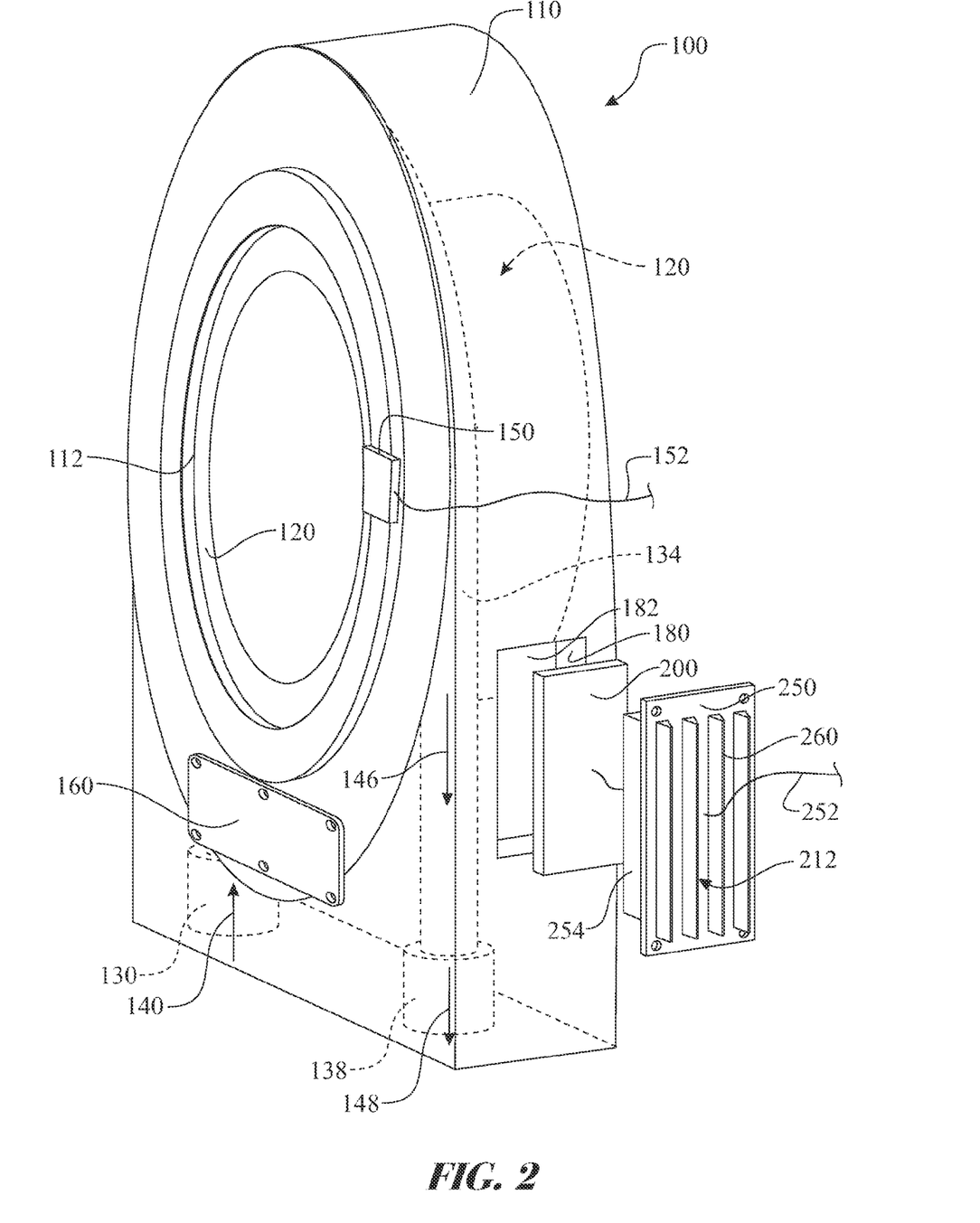
FIG. 2 presents an isometric exploded assembly view of the exemplary bearing assembly comprising the Thermo-Electric Generator (TEG), originally introduced in FIG. 1.

A power harvesting bearing assembly 100 is illustrated in FIGS. 1 and 2. A power harvesting bearing assembly 100 includes a bearing assembly 120 retained within a bearing housing 110 by a bearing subassembly receptacle 112. The exemplary bearing assembly 120 includes a bearing outer ring 122, a bearing inner ring 124 located within the bearing outer ring 122, and a series of inter ring bearings 126 rotationally assembled between the bearing outer ring 122 and bearing inner ring 124. The inter ring bearings 126 can be spherical, cylindrical, conical, dual-conical, and the like. The mating surfaces of the rings 122, 124 would be designed to accommodate the selected bearing shape. A bearing inner circumferential surface 128 is formed on an inner surface of the bearing inner ring 124. The bearing inner circumferential surface 128 engages with the rotating member, such as a shaft.

Bearing housings 110 are configured in a variety of form factors, having a multitude of optional configurations. One optional feature is an inclusion of an integrated bearing cooling passage system within the bearing housing 110. The optional integrated bearing cooling passage system provides a thermal transfer system to remove heat generated by the rotation of the bearing and/or other rotating components in contact with the bearing. The integrated bearing cooling passage system comprises a cooling system supply port 130, at least one integrated liquid cooling passage 134, and a cooling system return port 138; all in fluid communication with one another. The integrated bearing cooling system would additionally comprise a liquid coolant, an external heat exchanger to remove heat from the liquid coolant, and a pump for driving the liquid coolant through the integrated liquid cooling segments. These components are well known to those skilled in the art.

The integrated bearing cooling passage system initiates at a cooling system supply port 130, which supplies a coolant at a lower temperature into the integrated bearing cooling passage system. The cooler coolant can be transferred directly to an integrated liquid cooling passage 134 (as illustrated in FIG. 2) or via an optional cooling fluid supply transfer conduit 132 provided in fluid communication between the cooling system supply port 130 and the integrated liquid cooling passage 134 (as illustrated in FIG. 1).

The integrated liquid cooling passage 134 is routed within the bearing housing 110 to optimize thermal transfer and heat removal from the power harvesting bearing assembly 100. The coolant is returned to a heat exchanger (not shown) through a cooling system return port 138. The integrated liquid cooling passage 134 can be in direct fluid communication with the cooling system return port 138 (as illustrated in FIG. 2) or via an optional cooling fluid return transfer conduit 136 provided in fluid communication between the integrated liquid cooling passage 134 and the cooling system return port 138 (as illustrated in FIG. 1).

As fluid flows through the integrated bearing cooling passage system, the coolant draws heat from the power harvesting bearing assembly 100. A low temperature supply coolant fluid 140 enters the cooling system supply port 130 at either ambient or a chilled temperature. As the low temperature supply coolant fluid 140 transfers to an entry segment of the integrated liquid cooling passage 134, the fluid can be referred to as a low temperature coolant fluid 142. As the coolant continues flowing through the integrated bearing cooling passage system, more specifically, the integrated liquid cooling passage 134, the coolant draws heat from the power harvesting bearing assembly 100. As the coolant passes through the segment of the integrated liquid cooling passage 134 proximate the bearing assembly 120, the coolant draws heat from the bearing assembly 120. During this heat exchanging process, the coolant is referred to as a thermally transferring fluid 144. As the path of the integrated liquid cooling passage 134 diverges the integrated liquid cooling passage 134 away from the bearing assembly 120, the thermally transferring fluid 144 is no longer drawing heat from the bearing subassembly 120. The integrated liquid cooling passage 134 is routed to initially converge upon the bearing subassembly 120, follows the contour of the bearing subassembly 120, then diverges from the bearing subassembly 120 to connect with the cooling system return port 138. The thermal transfer from the bearing assembly 120 to the coolant diminishes as the integrated liquid cooling passage 134 diverges away from the bearing assembly 120. At this stage in the process, the coolant is referred to as an elevated temperature coolant fluid 146. The coolant is discharged through the cooling system return port 138 for return to the heat exchanger (not shown). The returning, heated coolant is referred to as an elevated temperature return coolant fluid 148.

A thermo-generator cavity 180 extends inward from an exterior surface of the bearing housing 110, terminating at a thermo-generator cavity end wall 182. The location for forming the thermo-generator cavity 180 within the bearing housing 110 considers the thermal gradient during operation of the bearing assembly power harvesting bearing assembly 100. The location also considers the proximity of electrically operated devices, such as one or more condition sensors 150. The preferred location optimizes between the operating temperature of the region of the bearing housing and the distance and path for routing electrical wiring between the Thermo-Electric Generator (TEG) 200 and the electrically operated devices.

A Thermo-Electric Generator (TEG) 200 is thermally coupled to a thermo-generator cavity end wall 182 of the thermo-generator cavity 180 extending inward from an exterior surface of the bearing housing 110. The Thermo-Electric Generator (TEG) 200 can be sandwiched between the thermo-generator cavity end wall 182 and a thermo-generator cavity filler 254. The thermo-generator cavity filler 254 is preferably fabricated of a material having a high level of thermal conductivity. The thermo-generator cavity filler 254 provides thermal transfer from the ambient air temperature proximate the installed Thermo-Electric Generator (TEG) 200. The Thermo-Electric Generator (TEG) 200 can be secured within the thermo-generator cavity 180 by a thermoelectric generator cover plate 250. An optional series of thermal cooling fins 260 can be integrated into an exterior, exposed surface of the thermoelectric generator cover plate 250, wherein the series of thermal cooling fins 260 increase the thermal transfer of the ambient air temperature to the Thermo-Electric Generator (TEG) 200. This provides a more efficient low temperature source 212 to the Thermo-Electric Generator (TEG) 200.

The thermoelectric generator cover plate 250 can be secured to the bearing housing 110 using any mechanical coupling configuration known by those skilled in the art. Examples of suitable mechanical coupling configurations include threaded fasteners (such as bolts, screws, and the like), a mounting bracket, rivets, adhesive, and the like. The Thermo-Electric Generator (TEG) 200 converts thermal energy (in the form of a difference in temperature) into electric energy. The generated electric energy is transferred to an electrically operated device, an electric power storage device, and the like by generator power output wiring 252 (FIGS. 1-3) or a passive wireless power transfer system 270 (FIG. 4). The generator power output wiring 252 can be provided in any of a variety of form factors, including wires, a bundle of wires or cabling, a ribbon cable, and the like. The product designer would determine the location where the generator power output wiring 252 connects to the Thermo-Electric Generator (TEG) 200. As an alternative to the wired solution, the generated electric energy can be transferred to an electrically operated device using any suitable wireless transmission power transfer system 270, including passive wireless communication, and the like. A power radiating antenna would be matched with a power receiving antenna in electrical communication with either an electrical power storage device, an electrically operated device, and the like.

A thermally conductive pad or adhesive 202 can be employed between contacting surface of each of the Thermo-Electric Generator (TEG) 200 and the thermo-generator cavity end wall 182 to optimize thermal transfer therebetween. The Thermo-Electric Generator (TEG) 200 is secured within the thermo-generator cavity 180. The thermo-generator cavity 180 is formed at a location proximate the segment of the integrated liquid cooling passage 134 containing the elevated temperature coolant fluid 146. The region proximate the segment of the integrated liquid cooling passage 134 containing the elevated temperature coolant fluid 146 provides a high temperature source 210 for operation of the Thermo-Electric Generator (TEG) 200. The opposing surface of the Thermo-Electric Generator (TEG) 200 provides a low temperature source 212 for operation of the Thermo-Electric Generator (TEG) 200. A thermo-generator cavity filler 254 can be sandwiched between the cool side of the Thermo-Electric Generator (TEG) 200 and the interior surface of the thermoelectric generator cover plate 250. The thermo-generator cavity filler 254 increases the thermal transfer of the temperature of the ambient air to the cool side of the Thermo-Electric Generator (TEG) 200.

Since the combination of the exterior surface of the thermoelectric generator cover plate 250 and the thermo-generator cavity filler 254 provides the low temperature source 212, a planar configuration relies upon localized airflow and ambient cooling to maintain a lower temperature. A series of thermal cooling fins 260 can extend from the exposed surface of the thermoelectric generator cover plate 250 to enhance the cooling of the low temperature source 212. The series of thermal cooling fins 260 increases the efficiency of the Thermo-Electric Generator (TEG) 200 by optimizing the thermal difference across the Thermo-Electric Generator (TEG) 200. The thermal cooling fins 260 would be attached to the exterior of the thermoelectric generator cover plate 250 employing any known cooling fin attachment technology to maintain a lower temperature for the low temperature source 212.

The thermal difference between the high temperature source 210 and the low temperature source 212 cause the Thermo-Electric Generator (TEG) 200 to generate an electric energy output. Details of the operation of the Thermo-Electric Generator (TEG) 200 are presented in FIG. 3 and will be described below.

The power harvesting bearing assembly 100 can include a condition sensor 150 or other electrically operated component. Electrical power is transferred from the Thermo-Electric Generator (TEG) 200 to the condition sensor 150 by connecting the generator power output wiring 252 to a condition sensor wiring 152. The condition sensor wiring 152 provides an electrical communication channel between the condition sensor 150 and the generator power output wiring 252. It is understood that the Thermo-Electric Generator (TEG) 200 can provide electrical power to sensors 150 and other electrically operated component located in the general vicinity of the power harvesting bearing assembly 100, including bearing sensors located on other bearing assemblies; temperature sensors; load sensors; revolution counters; speed sensors; microphones; SEE sensors; torque sensors; GPS sensors; communication devices (wired or wireless); communication devices (wired or wireless); alarms; data recording devices (including computers, magnetic tape drives, digital recording devices, disc recording devices, and the like); controllers, and the like.

One or more service access panels 160 can be provided on the bearing housing 110, where the service access panels 160 provide access to interior elements for inspection, servicing, and repairs.

The Thermo-Electric Generator (TEG) 200 comprises elements of any Thermo-Electric Generator (TEG) known by those skilled in the art. The exemplary embodiment of the Thermo-Electric Generator (TEG) 200 presented herein illustrates one embodiment to describe various elements, the components inter-relation, and function thereof.

The Thermo-Electric Generators (TEG's) 200 are commonly available in a variety of form factors. They are available is a variety of different sizes and performance levels. The Thermo-Electric Generators (TEG's) 200 are offered utilizing either of two technologies: (a) normal thermo couples and (b) thin film technology.

Thermo coupled based Thermo-Electric Generators (TEG's) 200 utilize a thermocouple consists of two conductors of different materials (usually metal alloys). Any junction of dissimilar metals will produce an electric potential related to temperature. The thermocouple produces a voltage in the vicinity of the point where the two conductors contact one another. The voltage in turn generates an electric current. The concept utilizes what is referred to as the Peltier effect. The Peltier effect is the presence of heat at an electrified junction of two different metals. When a current is made to flow through a junction composed of materials A and B, heat is generated at the upper junction at T2, and absorbed at the lower junction at T1. The Thermo-Electric Generator (TEG) applies the thermocouple in accordance with the reverse concept of the Peltier effect, whereby the presence of heat at the upper junction T2, and the presence of a reduced temperature at the lower junction at T1 the thermocouple generates a current.

Thin film technology based Thermo-Electric Generators (TEG's) 200 utilize semiconductor based technology. Thermocouple based Thermo-Electric Generators (TEG's) 200 were efficiencies rarely exceeded 3%. With the advent of semiconductors the efficiency of Thermo-Electric Generators (TEG's) 200 was greatly increased. Therefore, the disclosure focuses on the thin film technology based Thermo-Electric Generators (TEG's) 200.

Figure 3:
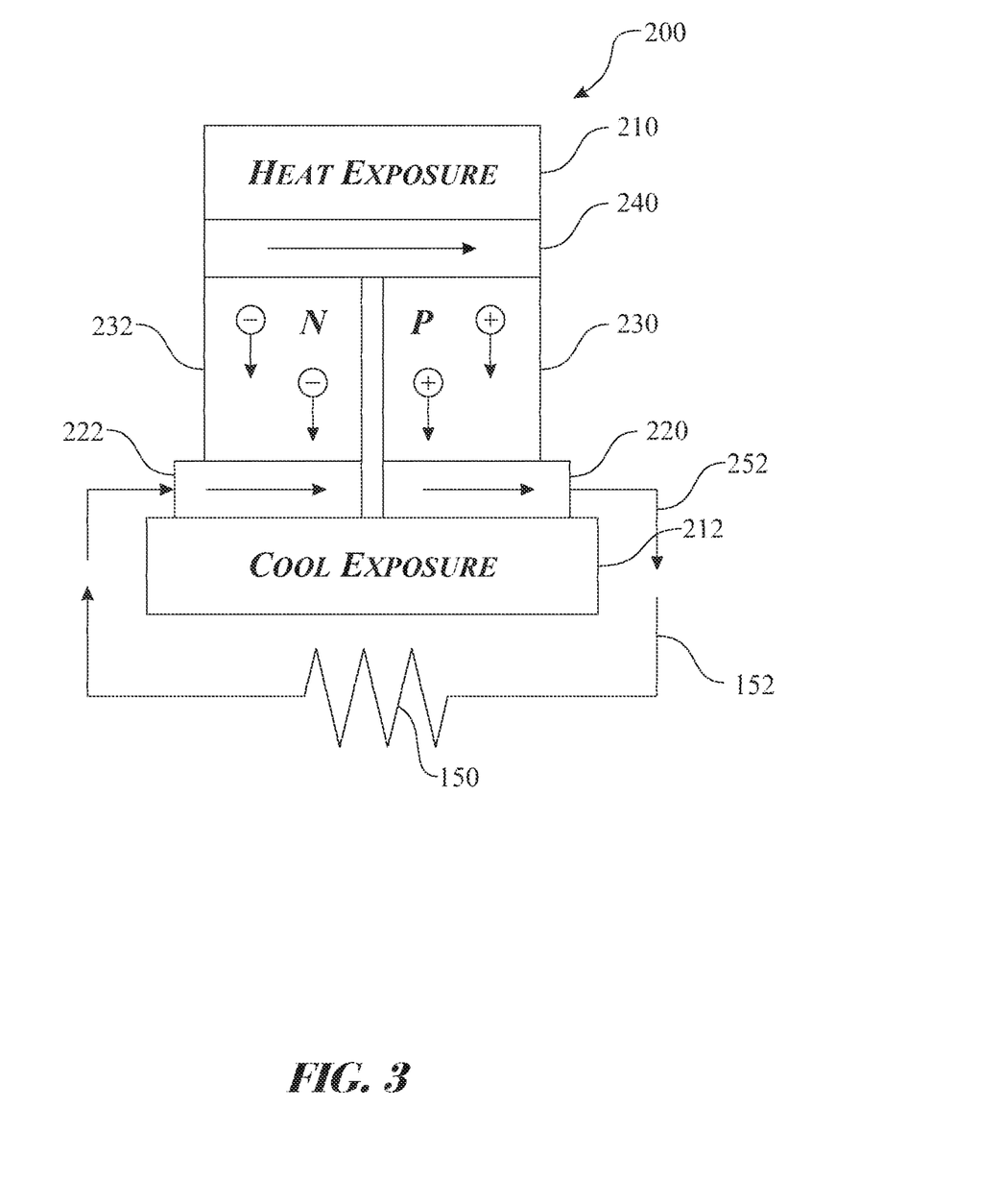
FIG. 3 presents an exemplary schematic illustrating operational elements of an exemplary thin film based Thermo-Electric Generator (TEG)
Figure 4:
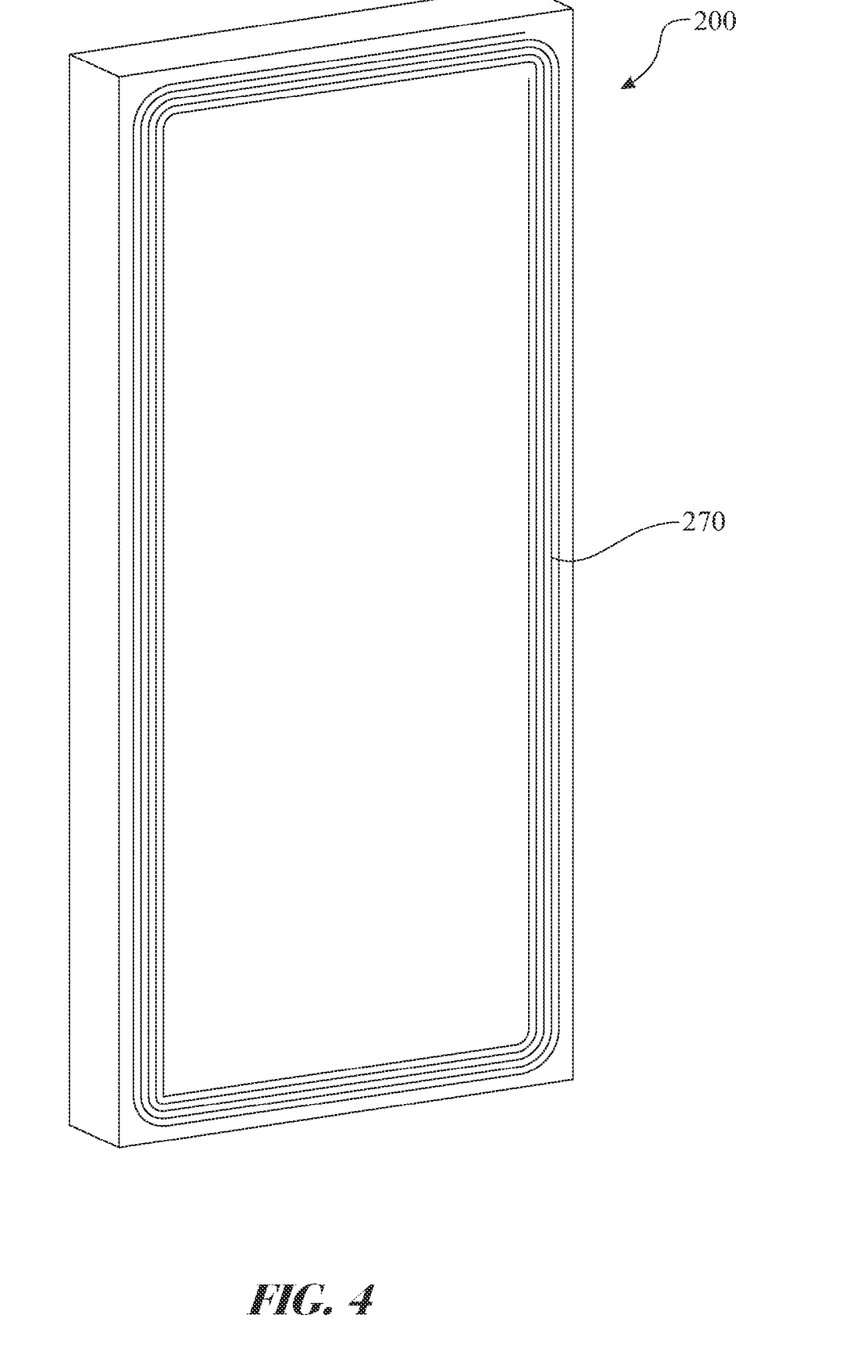
FIG. 4 presents an exemplary Thermo-Electric Generator (TEG) utilizing a passive wireless power transmission system.

An exemplary schematic illustrating operational components of a thin film technology based Thermo-Electric Generators (TEG's) 200 is presented in FIG. 3. The Thermo-Electric Generator (TEG) 200 is exposed to a difference in temperature. One side of the Thermo-Electric Generator (TEG) 200 is exposed to a high temperature source 210. The opposite side of the Thermo-Electric Generator (TEG) 200 is exposed to a low temperature source 212. The key component to the Thermo-Electric Generator (TEG) 200 is the p-type semiconductor elements 230 and n-type semiconductor elements 232. Thermal transfer between the high temperature source 210 and semiconductor elements 230, 232 is accomplished by a hot carrier 240. The hot carrier 240 is commonly the contacting or attachment member or section of the Thermo-Electric Generator (TEG) 200. A P side cold carrier 220 and an N side cold carrier 222 are commonly the exposed member or section of the Thermo-Electric Generator (TEG) 200. The hot carrier 240 and cold carriers 220, 222 are located at opposite ends of the semiconductor elements 230, 232. The thermal difference between the hot carrier 240 and cold carriers 220, 222 causes the semiconductor elements 230, 232 to generate a current, which is carried by the generator power output wiring 252.

The Thermo-Electric Generator (TEG) 200 consists of leg pairs of p-type semiconductor elements 230 and n-type semiconductor elements 232. Each leg pair generates a certain voltage. The voltage (U) generated by a Thermo-Electric Generator (TEG) 200 is directly proportional to the number of leg pairs (N) and the temperature difference (ΔT) between top and bottom side times the Seebeck coefficient (α), where:

$$U = N(\text{times}) \Delta T (\text{times}) \alpha.$$

The Seebeck effect is caused by two things: charge-carrier diffusion and phonon drag. Charge carriers in the materials will diffuse when one end of a conductor is at a different temperature from the other. Hot carriers diffuse from the hot carrier 240 to the low temperature source 212, since there is a lower density of hot carriers at the cold end of the conductor, and vice versa. The movement of heat (in the form of hot charge carriers) from one end to the other is a heat current and an electric current as charge carriers are moving.

Recently developed thermoelectric devices are made from alternating p-type semiconductor elements 230 and n-type semiconductor elements 232 connected by metallic connectors. Semiconductor junctions are common in power generation devices, while metallic junctions are more common in temperature measurement. The electrical charge flows through the n-type element 232, crosses a metallic interconnect, and passes into the p-type element 230. The resulting current passes through the generator power output wiring 252.

The generator power output wiring 252 is connected to any electrically operated device, such as the condition sensor 150. In a wired configuration, the generator power output wiring 252 is connected to the condition sensor wiring 152 to transfer the electrical energy from the Thermo-Electric Generator (TEG) 200 to the condition sensor 150, as illustrated in FIG. 3. Alternatively, the Thermo-Electric Generator (TEG) 200 can transfer power to any electrically operated device using a passive wireless power transfer system 270, as illustrated in FIG. 4.

In operation, the Thermo-Electric Generator (TEG) 200 is thermally coupled to a thermo-generator cavity end wall 182 of a thermo-generator cavity 180, wherein the thermo-generator cavity 180 extends inward from an exterior surface of the bearing housing 110, terminating at the thermo-generator cavity end wall 182. As the bearing rotates, friction and other interactions generate heat. The induced heat elevates the temperature of the bearing housing 110. The thermo-generator cavity 180 exposes the Thermo-Electric Generator (TEG) 200 to a high temperature source 210 having a higher temperature, as the cavity positions the Thermo-Electric Generator (TEG) 200 closer to the heat source. The thermo-generator cavity 180 reduces the thermal gradient between the heat source (generally the bearing subassembly 120) and the Thermo-Electric Generator (TEG) 200. The Thermo-Electric Generator (TEG) 200 is exposed to and positioned between a difference in temperature between a location within the bearing housing 110 (the high temperature source 210) and the ambient environment (the low temperature source 212). The difference in temperature between the location within bearing housing 110 and the ambient environment causes the Thermo-Electric Generator (TEG) 200 to generate a voltage, which creates a current when electrically coupled to a load, as illustrated in FIG. 3. The generated electric power is transferred by the generator power output wiring 252 or the passive wireless power transfer system 270 for either storage or use by electrically powered devices, such as the condition sensor 150.

The system can be enhanced with the inclusion of an integrated bearing cooling passage system within the bearing housing 110. Fluid flows through the integrated bearing cooling passage system to remove heat from the power harvesting bearing assembly 100. The integrated bearing cooling passage system includes an integrated liquid cooling passage 134, which is routed to flow adjacent to the bearing assembly 120. As the coolant flows along the integrated liquid cooling passage 134, the coolant transitions from a low temperature coolant fluid 142, to a thermally transferring fluid 144, and ultimately to an elevated temperature coolant fluid 146. The elevated temperature coolant fluid 146 elevates the temperature of the portion of the bearing housing 110 in the general vicinity as a result of conductive thermal properties and a thermal gradient. The thermo-generator cavity 180 would be formed at a location proximate the region having the elevated temperature. The thermo-generator cavity 180 would have a depth that positions the Thermo-Electric Generator (TEG) 200 at a suitable distance from the heat source, while maintaining mechanical integrity between the thermo-generator cavity end wall 182 and the integrated liquid cooling passage 134. As previously described, the exposed ambient air temperature provides the second portion or the low temperature source 212 (via the thermo-generator cavity filler 254) required to create the temperature delta for operation of the Thermo-Electric Generator (TEG) 200. The temperature difference between the high temperature source 210 and the low temperature source 212 causes the Thermo-Electric Generator (TEG) 200 to generate electric power.

It is understood that the Thermo-Electric Generator (TEG) 200 can be selected from any available or custom designed operating and physical design. The operating characteristics can be designed for any anticipated operational thermal difference and voltage or current output.

Since many modifications, variations, and changes in detail can be made to the described preferred embodiments of the invention, it is intended that all matters in the foregoing description and shown in the accompanying drawings be interpreted as illustrative and not in a limiting sense. Thus, the scope of the invention should be determined by the appended claims and their legal equivalence.

| Ref. No. | Description |
| --- | --- |
| 100 | power harvesting bearing assembly |
| 110 | bearing housing |
| 112 | bearing receptacle |
| 120 | bearing subassembly |
| 122 | bearing outer ring |
| 124 | bearing inner ring |
| 126 | inter ring bearings |
| 128 | bearing inner circumferential surface |
| 130 | cooling system supply port |
| 132 | cooling fluid supply transfer conduit |
| 134 | integrated liquid cooling passage |
| 136 | cooling fluid return transfer conduit |
| 138 | cooling system return port |
| 140 | low temperature supply coolant fluid |
| 142 | low temperature coolant fluid |
| 144 | thermally transferring fluid |
| 146 | elevated temperature coolant fluid |
| 148 | elevated temperature return coolant fluid |
| 150 | condition sensor |
| 152 | condition sensor wiring |
| 160 | service access panel |
| 180 | thermo-generator cavity |
| 182 | thermo-generator cavity end wall |
| 200 | Thermo-Electric Generator (TEG) |
| 202 | thermally conductive material |
| 210 | high temperature source |
| 212 | low temperature source |
| 220 | P side cold carrier |
| 222 | N side cold carrier |
| 230 | p-type semiconductor elements |
| 232 | n-type semiconductor elements |
| 240 | hot carrier |
| 250 | thermoelectric generator cover plate |
| 252 | generator power output wiring |
| 254 | thermo-generator cavity filler |
| 260 | thermal cooling fins |
| 270 | passive wireless power transfer system |

What is claimed is:
1. A power generating bearing assembly comprising:
a bearing housing comprising:
a bearing receptacle, and
at least one integrated liquid cooling passage routed proximate said bearing receptacle, wherein a fluid flow passing through said at least one integrated liquid cooling passage defines an ambient temperature supply segment and an elevated temperature return segment;

a thermo-generator cavity extending inward from an exterior surface of said bearing housing, said thermo-generator cavity being formed at a location proximate said elevated temperature return segment, said thermo-generator cavity terminating at a cavity end wall;

a bearing subassembly retained within said bearing receptacle; and a Thermo-Electric Generator (TEG) located within said thermo-generator cavity, said TEG being in thermal communication with a surface of said cavity end wall, wherein during operation, heat generated by rotation of said bearing subassembly elevates a temperature of said bearing housing, and said TEG converts a thermal difference between said bearing housing elevated temperature at said cavity end wall and an ambient temperature to electric power.

2. The power generating bearing assembly as recited in claim 1 further comprising:

a thermoelectric generator cover plate sealing said TEG within said thermo-generator cavity; and a thermo-generator cavity filler sandwiched between said TEG and said thermoelectric generator cover plate, said thermo-generator cavity filler being fabricated of a thermally conductive material.

3. The power generating bearing assembly as recited in claim 2, wherein said thermoelectric generator cover plate further comprises at least one cooling thermal cooling fin extending from an exterior, exposed surface thereof when said thermoelectric generator cover plate is assembled to said bearing housing.

4. The power generating bearing assembly as recited in claim 1, wherein said at least one integrated liquid cooling passage comprises a cooling system return port located at a discharge end of said at least one integrated liquid cooling passage, and said TEG is located proximate said cooling system return port.

5. The power generating bearing assembly as recited in claim 1, wherein said at least one integrated liquid cooling passage is routed to initially converge upon said bearing subassembly, follows a contour of said bearing subassembly, then diverges from said bearing subassembly to connect with said cooling system return port, and said TEG is located proximate said divergence between said at least one integrated liquid cooling passage and said bearing subassembly.

6. The power generating bearing assembly as recited in claim 1, wherein said TEG further utilizes operational components of one of thin film technology and normal thermocouple technology.

7. The power generating bearing assembly as recited in claim 1 further comprising:

a thermally conductive material assembled between mating surfaces of said TEG and said thermo-generator cavity end wall.

8. The power generating bearing assembly as recited in claim 1 further comprising:

a condition sensor, wherein power generated from said TEG operates said condition sensor.

* * * * *